United States Patent
Sato

(10) Patent No.: US 12,438,058 B2
(45) Date of Patent: Oct. 7, 2025

(54) SEMICONDUCTOR APPARATUS

(71) Applicant: FUJI ELECTRIC CO., LTD., Kawasaki (JP)

(72) Inventor: Tadahiko Sato, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 324 days.

(21) Appl. No.: 18/173,912

(22) Filed: Feb. 24, 2023

(65) Prior Publication Data

US 2023/0335448 A1 Oct. 19, 2023

(30) Foreign Application Priority Data

Apr. 13, 2022 (JP) .................. 2022-066195

(51) Int. Cl.
| | |
|---|---|
| H01L 23/00 | (2006.01) |
| H01L 21/48 | (2006.01) |
| H01L 21/52 | (2006.01) |
| H01L 21/56 | (2006.01) |
| H01L 23/053 | (2006.01) |

(52) U.S. Cl.
CPC ........ *H01L 23/053* (2013.01); *H01L 21/4853* (2013.01); *H01L 21/52* (2013.01); *H01L 21/56* (2013.01); *H01L 24/48* (2013.01); *H01L 2224/48157* (2013.01); *H01L 2924/13055* (2013.01); *H01L 2924/13091* (2013.01)

(58) Field of Classification Search
CPC ... H01L 23/053; H01L 21/4853; H01L 21/52; H01L 21/56; H01L 24/48; H01L 2224/48157; H01L 2924/13055; H01L 2924/13091; H01L 23/24; H01L 23/3135; H01L 23/3735; H01L 23/49811; H01L 24/40; H01L 23/04; H01L 23/057; H01L 23/3142
See application file for complete search history.

(56) References Cited

U.S. PATENT DOCUMENTS

| | | |
|---|---|---|
| 2016/0155687 A1 | 6/2016 | Takizawa |
| 2017/0006721 A1 | 1/2017 | Soyano |
| 2019/0157221 A1 | 5/2019 | Soyano |
| 2020/0091025 A1 | 3/2020 | Ichimura |
| 2020/0126947 A1 | 4/2020 | Karasawa |

FOREIGN PATENT DOCUMENTS

| | | |
|---|---|---|
| JP | 11330344 A | 11/1990 |
| JP | 2003142515 A | 5/2003 |
| JP | 2012049378 A | 3/2012 |

(Continued)

*Primary Examiner* — Elias Ullah

(57) ABSTRACT

A semiconductor apparatus includes: a base, an insulating substrate arranged on the base, a semiconductor element arranged on the insulating substrate, a case joined to the base and housing the semiconductor element, and a sealing material supplied in the case. The case includes a terminal block that extends in a first direction from an inner wall surface of the case. The terminal block is arranged thereon a terminal that is electrically connected to the semiconductor element via a wiring member. The terminal block includes a projecting portion that extends, in plan view, in the first direction from a first position of a distal end portion of the terminal to a second position. A first distance between the first position and the second position is at least 1 mm.

14 Claims, 9 Drawing Sheets

(56) References Cited

FOREIGN PATENT DOCUMENTS

| | | | |
|---|---|---|---|
| JP | 2016054330 | A | 4/2016 |
| JP | 2016111028 | A | 6/2016 |
| JP | 2017017195 | A | 1/2017 |
| JP | 2020047763 | A | 3/2020 |
| JP | 2020064992 | A | 4/2020 |
| WO | 2018142863 | A1 | 8/2018 |

SEMICONDUCTOR APPARATUS

CROSS REFERENCE TO RELATED APPLICATION

This application claims priority from Japanese Patent Application No. 2022-066195, which was filed on Apr. 13, 2022, and the entire contents of which is incorporated herein by reference.

BACKGROUND

Field of the Invention

The present disclosure relates to a semiconductor apparatus for use in power electronic devices, such as inverters.

Description of Related Art

Known in the art is a semiconductor apparatus for use in a power electronic device. The semiconductor apparatus includes a base to which a cooling part is joined, an insulating substrate arranged on the base, a semiconductor element arranged on the insulating substrate, and a case in which the semiconductor element is housed and that is provided with a sealing material (refer to, for example, JP H11-330344 A, JP 2020-64992 A, and JP 2003-142515 A).

In the above-described conventional semiconductor apparatus, the case is provided with a terminal block, and arranged thereon is a terminal that is electrically connected to the semiconductor element via a wiring member.

With such a configuration, if a creepage distance between the terminal arranged on the terminal block and the base is short, a problem may arise such that an insulation resistance between the terminal and the base decreases if a sealing material peels away from an inner wall surface of the case.

SUMMARY

The present disclosure has been made in view of the above-described problem, and an object of the present disclosure is to reduce susceptibility to electrical failure between a terminal that is arranged on a terminal block and a base in a semiconductor apparatus that includes the terminal block.

A semiconductor apparatus according to one aspect of the present disclosure includes: a base; an insulating substrate arranged on the base; a semiconductor element arranged on the insulating substrate; a case joined to the base and housing the semiconductor element; and a sealing material supplied in the case, in which: the case includes a terminal block that extends in a first direction from an inner wall surface of the case, the terminal block is arranged thereon a terminal that is electrically connected to the semiconductor element via a wiring member, the terminal block includes a projecting portion that extends, in plan view, in the first direction from a first position of a distal end portion of the terminal to a second position, and a first distance between the first position and the second position is at least 1 mm.

According to the present disclosure, compared with a configuration that includes a wall surface of a terminal block that reaches a base positioned immediately below a distal end of a terminal, a creepage distance is increased by a length of the projecting portion. The projecting portion includes a surface that extends in the first direction, and provides for easy application and confirmation of application of a primer.

As a result, adhesion of a sealing material to the inner wall surface of the case can be enhanced, and peeling of the sealing material from the inner wall surface can be prevented.

DESCRIPTION OF EMBODIMENTS

Figure 1:
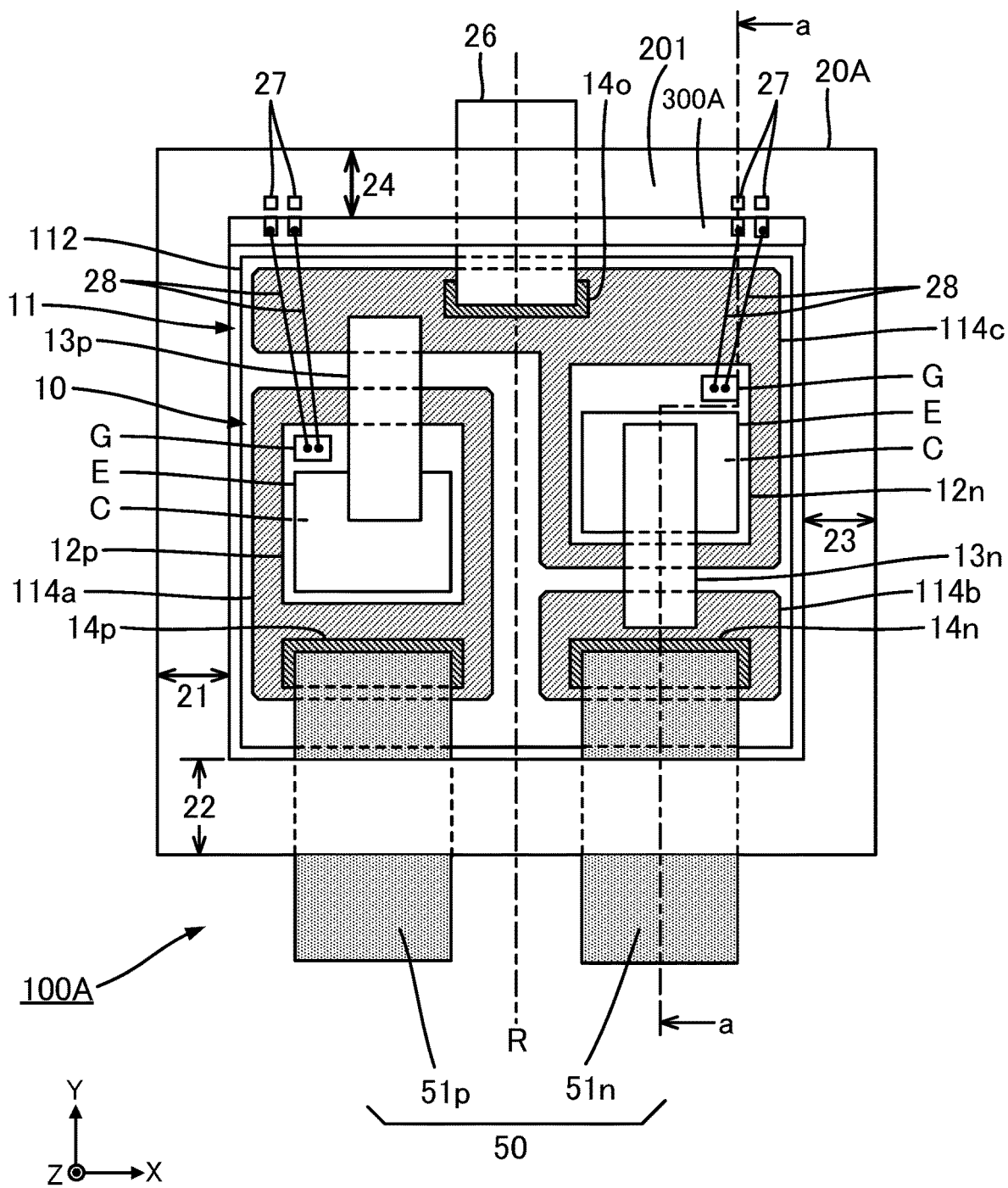
FIG. 1 is a plan view of a semiconductor apparatus 100A according to a first embodiment.

Embodiments for carrying out the present disclosure will be described with reference to the drawings. Dimensions and scales of elements shown in the drawings may differ from those of actual elements. In the embodiments described below, specific examples are assumed that correspond to instances of disclosed implementations. Accordingly, the scope of the present disclosure is not limited to the following embodiments.

First Embodiment

Figure 2:
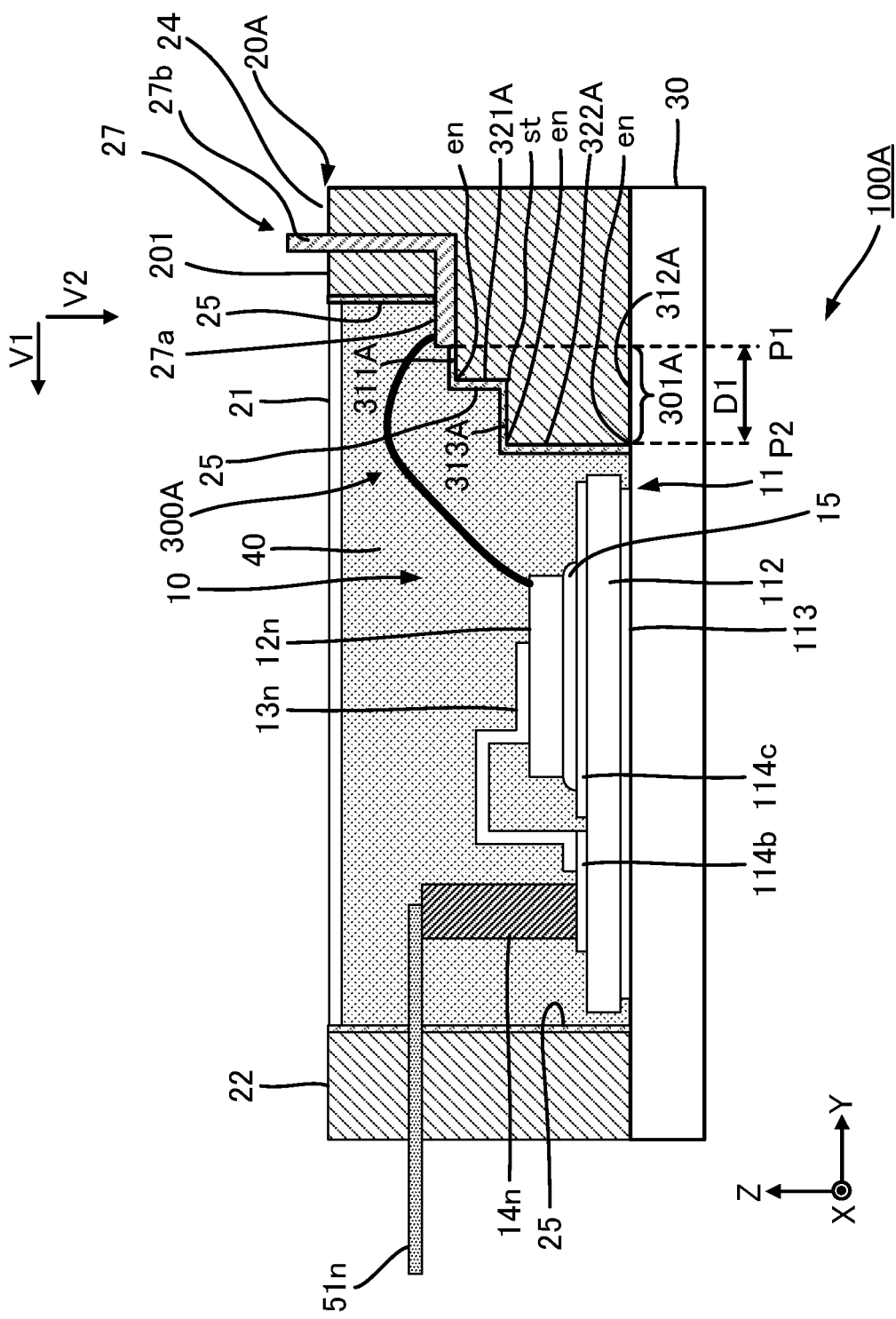
FIG. 2 is a cross-sectional view taken along line a-a in FIG. 1.
Figure 3:
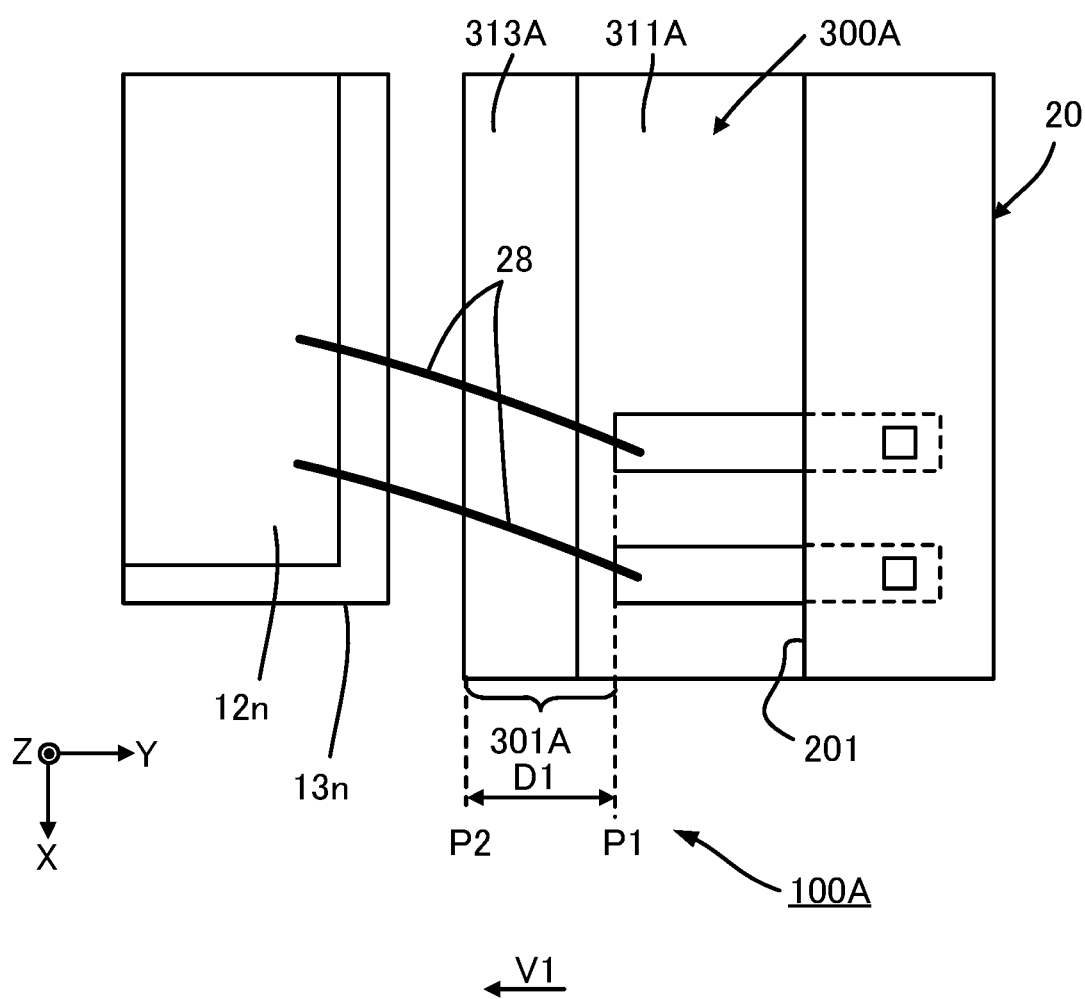
FIG. 3 is a plan view of a terminal block 300A of FIG. 2.

FIG. 1 is a plan view illustrating a configuration of a semiconductor apparatus 100A according to a first embodiment. FIG. 2 is a cross-sectional view taken along line a-a in FIG. 1. FIG. 3 is a plan view of a terminal block 300A in FIG. 2.

Hereinafter, the configuration of the semiconductor apparatus 100A will be described in which an orthogonal coordinate system of a right screw system has an X axis, a Y axis, and a Z axis orthogonal to each other. One direction along the X axis is referred to as a +X direction, and a direction opposite to the +X direction is referred to as a −X direction. One direction along the Y axis is referred to as a +Y direction, and a direction opposite to the +Y direction is referred to as a −Y direction. Similarly, one direction along the Z axis is referred to as a +Z direction, and a direction opposite to the +Z direction is referred to as a −Z direction. Hereinafter, a view of an element of the semiconductor apparatus 100A along the Z axis direction is referred to as a "plan view."

Although in use the semiconductor apparatus 100A can be installed in any appropriate orientation, for sake of convenience in the following description the +Z direction is assumed to be an upward direction and the −Z direction is assumed to be a downward direction. Thus, a surface facing the +Z direction among freely selected elements of the semiconductor apparatus 100A may be described as an "upper surface," and a surface facing the −Z direction among the freely selected elements may be described as a "lower surface." As illustrated in FIG. 1, in the following description, a virtual plane (hereinafter, "reference surface") R is parallel to a YZ plane. The reference surface R is located at the center of the semiconductor apparatus 100A in the X axis direction. That is, the reference surface R is a plane that divides the semiconductor apparatus 100A into two halves in the X axis direction.

As illustrated in FIGS. 1 and 2, the semiconductor apparatus 100A according to the first embodiment includes a semiconductor unit 10, a case 20A, a base 30, a sealing material 40, and a connecting portion 50. In FIG. 1, illustrations of the base 30 and the sealing material 40 are omitted for convenience.

The base 30 supports the semiconductor unit 10 and the case 20A, and is formed of a conductive material such as aluminum or copper. The base 30 may be used as a heat sink. The base 30 may constitute a cooling part such as a fin or a water cooling jacket for cooling the semiconductor unit 10. The base 30 may be used as a ground body set to ground potential.

The case 20A is a structure that houses the semiconductor unit 10. Specifically, the case 20A is rectangular in shape and encloses the semiconductor unit 10. As illustrated in FIG. 2, the semiconductor unit 10 is housed in the case 20A with the base 30 and acts as a bottom surface.

The sealing material 40 seals semiconductor unit 10 in the case 20A. The sealing material 40 may be constituted from a variety of resin materials such as an epoxy resin or a silicone gel, and may include a variety of fillers, such as a silicon oxide or an aluminum oxide.

As illustrated in FIGS. 1 and 2, the semiconductor unit 10 includes an insulating substrate 11, a semiconductor element 12p, a semiconductor element 12n, a wiring portion 13p, a wiring portion 13n, a connection conductor 14p, a connection conductor 14n, and a connection conductor 14o. Hereinafter, an additional character p is added to a reference sign of an element corresponding to the semiconductor element 12p, and an additional character n is added to a reference sign of an element corresponding to the semiconductor element 12n. The semiconductor element 12p and the semiconductor element 12n will be simply referred to as the "semiconductor element 12" when need not be distinguished from one another. The same applies to other elements. As described above, the semiconductor unit 10 is housed in the case 20A, and the base 30 acts as a bottom surface. In this embodiment, the case 20A houses the semiconductor elements 12 (12p, 12n).

The insulating substrate 11 is a plate-shaped member that supports each semiconductor element 12 (12p, 12n), each wiring portion 13 (13p, 13n), and each connection conductor 14 (14p, 14n, 14o). For example, a laminated ceramic substrate such as a direct copper bonding (DCB) substrate or an active metal brazing (AMB) substrate, or a metal base substrate including a resin insulating layer may be used as the insulating substrate 11.

As illustrated in FIG. 2, the insulating substrate 11 is a substrate in which an insulating layer 112, a metal layer 113, and conductor patterns 114 (114a, 114b, 114c) are laminated. The insulating layer 112 is a rectangular plate-shaped member formed of an insulating material. The material of the insulating layer 112 is not limited to a particular material, and may be a ceramic material such as alumina ($Al_2O_3$), aluminum nitride (AlN), or silicon nitride ($Si_3N_4$), or a resin material such as an epoxy resin. The reference surface R is a plane that divides the insulating layer 112 into two halves in the X axis direction.

The metal layer 113 is a conductive film provided on a lower surface of the insulating layer 112 facing the base 30. The metal layer 113 is formed in the entire region or a part (e.g., a region other than the edge portion) of the lower surface of the insulating layer 112. A lower surface of the metal layer 113 is in contact with an upper surface of the base 30. The metal layer 113 is formed of, for example, a metal material having high thermal conductivity, such as copper or aluminum.

The conductor patterns 114 (114a, 114b, 114c) are conductive films that are spaced apart from each other on an upper surface of the insulating layer 112 on a side opposite to the base 30. Each conductor pattern 114 is formed of a low-resistance conductive material such as copper or a copper alloy.

As illustrated in FIG. 1, the conductor pattern 114a is a conductive film having a rectangular shape provided in a region of the upper surface of the insulating layer 112 in the −X direction as viewed from the reference surface R. The conductor pattern 114b is a conductive film having a rectangular shape provided in a region of the upper surface of the insulating layer 112 in the +X direction as viewed from the reference surface R. The conductor pattern 114c is a conductive film provided in the +Y direction as viewed from the conductor pattern 114a and the conductor pattern 114b. Specifically, the conductor pattern 114c is planar-shaped and includes a region located in the +Y direction of the conductor pattern 114a and a region located in the +Y direction of the conductor pattern 114b.

The semiconductor elements 12 (12p, 12n) are power semiconductors that can switch a large current. Specifically, each semiconductor element 12 may include a transistor, such as an insulated gate bipolar transistor (IGBT) or a metal-oxide-semiconductor field-effect transistor (MOSFET), a reverse conducting IGBT (RC-IGBT), a free wheeling diode (FWD). In the first embodiment, the semiconductor element 12 is an RC-IGBT, and includes an IGBT portion and an FWD portion.

Each semiconductor element 12 (12p, 12n) includes a main electrode E, a main electrode C, and a control electrode G. The main electrode E and the main electrode C are each electrodes to which a current to be controlled is input or output. The main electrode E is an emitter electrode that is arranged on an upper surface of the semiconductor element 12. The main electrode C is a collector electrode that is arranged on a lower surface of the semiconductor element 12. The main electrode C acts as an anode electrode of the FWD portion, and the main electrode E acts as a cathode electrode of the FWD portion. In contrast, the control electrode G is a gate electrode arranged on the upper surface of the semiconductor element 12. The control electrode G receives a voltage that controls ON/OFF of the semiconductor element 12. The control electrode G may include a detection electrode used for current detection, temperature detection, or the like.

As illustrated in FIG. 2, the semiconductor elements 12 (12p, 12n) are joined to the insulating substrate 11 by use of a joining material 15, such as a solder. As illustrated in FIG. 1, the semiconductor element 12p is joined to the conductor pattern 114a. That is, the main electrode C of the semiconductor element 12p is joined to the conductor pattern 114a. The semiconductor element 12n is joined to the conductor pattern 114c of the insulating substrate 11. Thus, the main electrode C of the semiconductor element 12n is joined to the conductor pattern 114c.

The wiring portion 13p in FIG. 1 electrically connects the main electrode E of the semiconductor element 12p to the conductor pattern 114c. The wiring portion 13p extends in the Y axis direction. An end of the wiring portion 13p located in the −Y direction is joined to the main electrode E of the semiconductor element 12p, and an end of the wiring portion 13p located in the +Y direction is joined to the conductor pattern 114c. In contrast, the wiring portion 13n electrically connects the main electrode E of the semiconductor element 12n to the conductor pattern 114b. The wiring portion 13n extends in the Y axis direction. An end of the wiring portion 13n located in the +Y direction is joined to the main electrode E of the semiconductor element 12n, and an end of the wiring portion 13n located in the −Y direction is joined to the conductor pattern 114b. The wiring portion 13p and the wiring portion 13n are lead frames formed of a low-resistance conductive material such as copper or a copper alloy.

The connection conductors 14 (14p, 14n, 14o) are formed of a low-resistance conductive material such as copper or a copper alloy. The connection conductor 14p is a conductor that electrically connects the semiconductor element 12p to an external device (not shown). Specifically, the connection conductor 14p is joined to the surface of the conductor pattern 114a with a joining material (not shown), such as a solder. That is, the connection conductor 14p is electrically connected to the main electrode C of the semiconductor element 12p via the conductor pattern 114a. The connection conductor 14p is located in the −Y direction as viewed from the semiconductor element 12p and the wiring portion 13p. As will be apparent from the above description, the semiconductor element 12p, the wiring portion 13p, and the connection conductor 14p are installed in the −X direction as viewed from the reference surface R.

The connection conductor 14n electrically connects the semiconductor element 12n to the external device. Specifically, the connection conductor 14n is joined to the surface of the conductor pattern 114b with a joining material (not shown) such as solder. That is, the connection conductor 14n is electrically connected to the main electrode E of the semiconductor element 12n via the conductor pattern 114b and the wiring portion 13n. The connection conductor 14n is located in the −Y direction as viewed from the semiconductor element 12n and the wiring portion 13n. As will be apparent from the above description, the semiconductor element 12n, the wiring portion 13n, and the connection conductor 14n are installed in the space in the +X direction as viewed from the reference surface R. The connection conductor 14p and the connection conductor 14n are arranged at an interval in the X axis direction.

The connection conductor 14o electrically connects the conductor pattern 114c to the external device. Specifically, the connection conductor 14o is joined to the surface of the conductor pattern 114c with a joining material (not shown), such as solder. That is, the connection conductor 14o is electrically connected to the main electrode E of the semiconductor element 12p via the conductor pattern 114c and the wiring portion 13p, and is electrically connected to the main electrode C of the semiconductor element 12n via the conductor pattern 114c.

As illustrated in FIG. 2, each of the connection conductor 14p, the connection conductor 14n, and the connection conductor 14o is a columnar structure protruding in the +Z direction from the insulating substrate 11. Each connection conductor 14 is rectangular-shaped. More specifically, each connection conductor 14 has a prismatic shape. The top surfaces as follows are located at positions higher than those of other elements of the semiconductor unit 10, namely, a top surface of the connection conductor 14p, a top surface of the connection conductor 14n, and a top surface of the connection conductor 14o. That is, in the direction of the Z axis, the top surface of each connection conductor 14 is positioned in the +Z direction as compared with the insulating substrate 11, each wiring portion 13, and each semiconductor element 12.

The case 20A in FIG. 1 hoses the semiconductor unit 10. Specifically, a lower surface of the case 20A is joined to an edge of the upper surface of the base 30 with an adhesive, for example. The semiconductor unit 10 is housed in the case 20A such that side surfaces of the insulating substrate 11 (insulating layer 112) face inner wall surfaces of the case 20A at intervals. The inner wall surfaces of the case 20A are wall surfaces (inner peripheral surfaces) facing the center side of the case 20A in plan view. The case 20A may be formed of a variety of resin materials such as a polyphenylene sulfide (PPS) resin, a polybutylene terephthalate (PBT) resin, a poly butylene succinate (PBS) resin, a polyamide (PA) resin, or an acrylonitrile-butadiene-styrene (ABS) resin. A filler material that is an insulating material may be provided in the case 20A.

As illustrated in FIG. 1, the case 20A of the first embodiment has a rectangular frame shape in which a side wall 21, a side wall 22, a side wall 23, and a side wall 24 connected to each other in the above order. The side wall 21 and the side wall 23 extend in the Y axis direction at a predetermined interval in the X axis direction; whereas the side wall 22 and the side wall 24 extend in the X axis direction at a predetermined interval in the Y axis direction. The side wall 22 and the side wall 24 connect each of the ends of the side wall 21 and the side wall 23 to each other. The connection conductor 14p and the connection conductor 14n of the semiconductor unit 10 are arranged at an interval along the side wall 22 and at positions spaced apart in the +Y direction from the inner wall surface of the side wall 22.

The connecting portion 50 is a terminal that electrically connects the semiconductor unit 10 to the external device. As illustrated in FIGS. 1 and 2, the connecting portion 50 includes a connection terminal 51p and a connection terminal 51n. Each connection terminal 51 (51p, 51n) is a thin plate-shaped electrode formed of a low-resistance conductive material such as copper or a copper alloy. Each connection terminal 51 may be covered with a conductive material such as nickel or a nickel alloy. The thickness of each of the connection terminal 51p and the connection terminal 51n may be 0.2 mm or more and 2.5 mm or less.

The connection terminal 51p is a positive electrode input terminal (P terminal) that electrically connects the semiconductor element 12p to the external device. The connection terminal 51n is a negative electrode input terminal (N terminal) that electrically connects the semiconductor element 12n to the external device. That is, a voltage higher than that of the connection terminal 51n is applied to the connection terminal 51p. The connection terminal 51p and the connection terminal 51n are electrically insulated from each other.

As illustrated in FIGS. 1 and 2, the connecting portion 50 extends through the side wall 22 of the case 20A in the Y axis direction. Specifically, one end of the connection terminal 51p is electrically connected to the connection conductor 14p, and extends through the side wall 22 of the case 20A in the −Y direction. One end of the connection terminal 51n is electrically connected to the connection conductor 14n, and extends through the side wall 22 of the case 20A in the −Y direction. In this embodiment, a main current is supplied to the semiconductor elements 12p and 12n via the connection terminals 51p and 51n that extend through the case 20A.

As illustrated in FIG. 1, a connection terminal 26 and control terminals 27 are arranged on the side wall 24 of the case 20A. The connection terminal 26 is a plate-shaped conductor that extends through the side wall 24 in the Y axis direction. A portion of the connection terminal 26 that extends through the inner wall surface of the side wall 24 is joined to the top surface of the connection conductor 14o. That is, the connection terminal 26 is electrically connected to the main electrode E of the semiconductor element 12p via the connection conductor 14o, the conductor pattern 114c, and the wiring portion 13p, and is electrically connected to the main electrode C of the semiconductor element 12n via the connection conductor 14o and the conductor pattern 114c. As will be apparent from the above description, the connection terminal 26 is an output terminal (O terminal) for electrically connecting each semiconductor element 12 (12p, 12n) to an external device.

The terminals 27 are control lead terminals that electrically connects the control electrode G of each semiconductor element 12 to an external device. Each terminal 27 is electrically connected to the control electrode G of each semiconductor element 12 (12p, 12n) by, for example, wiring members 28. Each terminal 27, the connection terminal 26, and the above-described connecting portion 50 are integrally formed with the case 20A by, for example, insert molding.

In this embodiment, the terminals 27 are arranged on the terminal block 300A. As illustrated in FIGS. 1 and 2, the side walls 21, 22, 23, and 24 of the case 20A define a housing portion 201 that houses the semiconductor elements 12p and 12n. The case 20A includes the terminal block 300A that extends in the −Y direction which is a first direction V1 from the inner wall surface of the housing portion 201 (specifically, the inner wall surface of the side wall 24). Each terminal 27 is arranged on the terminal block 300A.

More specifically, each terminal 27 is a conductor member in which two terminal portions, an inner terminal portion 27a having a long plate shape, and an outer terminal portion 27b having a quadrangular prism shape, are coupled in an L shape. A part of the inner terminal portion 27a in the longitudinal direction is arranged on an upper surface of a terminal block 300, and the remaining part is embedded in the side wall 24 of the case 20A. The outer terminal portion 27b is coupled at a vicinity of the end of the inner terminal portion 27a in the side wall 24, extends in the +Z direction in the side wall 24, and extends from the upper end surface of the side wall 24 to the exterior. Thus, a part in the longitudinal direction of each terminal 27 including the inner terminal portion 27a and the outer terminal portion 27b is embedded in the side wall 24 of the case 20A. The outer terminal portion 27b that extends from the upper end surface of the side wall 24 is electrically connected to the external device. The inner terminal portion 27a arranged on the terminal block 300A is electrically connected to the semiconductor element 12p or 12n via the wiring members 28.

As illustrated in FIGS. 2 and 3, the terminal block 300A includes a projecting portion 301A that extends in plan view from a first position P1 to a second position P2. The first position P1 is a distal end portion of the inner terminal portion 27a. The second position P2 is a position further moved by a first distance D1 in the first direction V1 (−Y direction) from the first position P1. The first distance D1 is at least 1 mm. The upper limit of the first distance D1 is within a range in which the projecting portion 301A (connecting surface 322A) does not contact the semiconductor unit 10 (insulating substrate 11). The first distance D1 may also be expressed such that the first distance D1 between the first position P1 and the second position P2 is shorter than the distance between the first position P1 and the semiconductor unit 10 (insulating substrate 11).

In this embodiment, the terminal block 300A has a first surface 311A located farthest from the base 30 and a second surface 312A joined to the base 30. The first surface 311A and the second surface 312A are parallel to the XY plane. The inner terminal portion 27a is arranged on the first surface 311A. Therefore, the surface of the inner terminal portion 27a extends in the +Z direction from the first surface 311A. The projecting portion 301A is located between the first surface 311A and the second surface 312A.

The projecting portion 301A further includes a third surface 313A. The third surface 313A is located between the first surface 311A and the second surface 312A in a second direction V2 (that is, in the −Z direction) approaching the base 30. The first surface 311A, the second surface 312A, and the third surface 313A are substantially parallel. Here, the phrase "substantially parallel" refers to a case in which the planes are inclined within a manufacturing error range.

In this embodiment, the end of the first surface 311A in the first direction V1 is an end position en of the surface. The end of the second surface 312A in the first direction V1 is an end position en of the surface. The end of the third surface 313A in the first direction V1 is an end position en of the surface. The end of the third surface 313A in a direction opposite to the first direction V1 is a start position st of the surface. The projecting portion 301A has a connecting surface 321A that connects the end position en of the first surface 311A with the start position st of the third surface 313A. The projecting portion 301A further has a connecting surface 322A that connects the end position en of the third surface 313A with the end position en of the second surface 312A. The connecting surfaces 321A and 322A extend in the second direction V2 (that is, in the −Z direction) approaching the base 30. The connecting surfaces 321A and 322A are parallel to the XZ plane. The projecting portion 301A includes a step portion that has two steps. One of the two steps includes the first surface 311A and the connecting surface 321A. The other includes the third surface 313A and the connecting surface 322A.

As illustrated in FIG. 2, a base film 25 is formed on the inner wall surface of the case 20A. The inner wall surface of the case 20A includes the inner wall surface of the housing portion 201, the first surface 311A, the connecting surface 321A, the third surface 313A, and the connecting surface 322A. The base film 25 covers the inner wall surface of the case 20A. The base film 25 acts as a primer that improves adhesion of the sealing material to the inner wall surface of the case 20A. A resin material appropriate for use as the material of the case 20A and the sealing material 40 is used for forming the base film 25. The base film 25 may be formed of, for example, a silane coupling agent, a polyimide resin, a polyamideimide resin, a polyamide resin, or a modified product thereof. In FIG. 1, the illustration of the base film 25 is omitted for convenience.

The foregoing description provides details of this embodiment. The projecting portion 301A extends from the first position P1 of the distal end portion of the inner terminal portion 27a to the second position P2, which is moved in plan view, by the first distance D1 in the first direction V1 (−Y direction).

According to this embodiment, as compared with the configuration in which the wall surface that reaches the base 30 provided immediately below the distal end portion of the inner terminal portion 27a, the creepage distance of the path from the base 30 to the distal end portion of the inner terminal portion 27a can be increased by at least the first distance D1. Therefore, it is possible to increase an insulation resistance of the base 30 and the inner terminal portion 27a when the sealing material 40 peels away.

According to this embodiment, it is possible to easily apply and confirm application of the primer to the inner wall surface of the case 20A. This feature is described below in detail.

In the semiconductor apparatus 100A, to prevent the sealing material from peeling away from the inner wall surface of the case 20A, it is necessary to enhance adhesion of the sealing material 40 to the inner wall surface of the case 20A. Therefore, during manufacture of the semiconductor apparatus 100A, before the case 20A is provided with the sealing material 40, and the base film 25 is formed on the inner wall surface of the case 20A by spraying the primer onto the surface from above the semiconductor apparatus 100A. This step is performed while visually checking from above the case 30A a status of application of the primer on the inner wall surface of the case. The visual check may be confirmed by photography via a camera installed above the case 20A.

With regard to the terminal block 300A, it is difficult to apply and confirm application of the primer on a side wall surface along the Z axis direction. This problem becomes more noticeable with an increase in the height of the terminal block 300A. It is of note that if the height of the terminal block 300A from the base 30 is increased, the creepage distance of the path from the base 30 to the distal end portion of the inner terminal portion 27a is increased. In this embodiment, the creepage distance is increased by providing the terminal block 300A with the projecting portion 301A that extends in the first direction V1 (−Y direction). Thus, it is possible to avoid an increase in an area of a surface on which it is difficult to apply and confirm application of the primer. Further, it is easier to apply and confirm application of the primer to the inner wall surface of the case 20A.

In the terminal block 300A of this embodiment, a section from the end position en of the first surface 311A to the end position en of the second surface 312A in the first direction V1 includes the connecting surface 321A, the third surface 313A, and the connecting surface 322A. Since the third surface 313A is viewed from above the case 20A, it is easy to apply and confirm application of the primer. According to this embodiment, it is possible to easily apply and confirm application of the primer to the inner wall surface of the case 20A.

In the terminal block 300A, the third surface 313A is interposed between the connecting surface 321A and the connecting surface 322A, each of which are side wall surfaces along the Z axis direction. That is, in the terminal block 300A, the third surface 313A cuts into the side wall surface along the Z axis direction, and the side wall surface is divided into the connecting surface 321A and the connecting surface 322A, which makes it difficult to apply and confirm application of the primer. In this embodiment, in the terminal block 300A, the area of each side wall surface along the Z axis direction on which it is difficult to apply and confirm application of the primer is reduced. According to this embodiment, it is possible to easily apply and confirm application of the primer to the inner wall surface of the case 20A.

Second Embodiment

Figure 4:
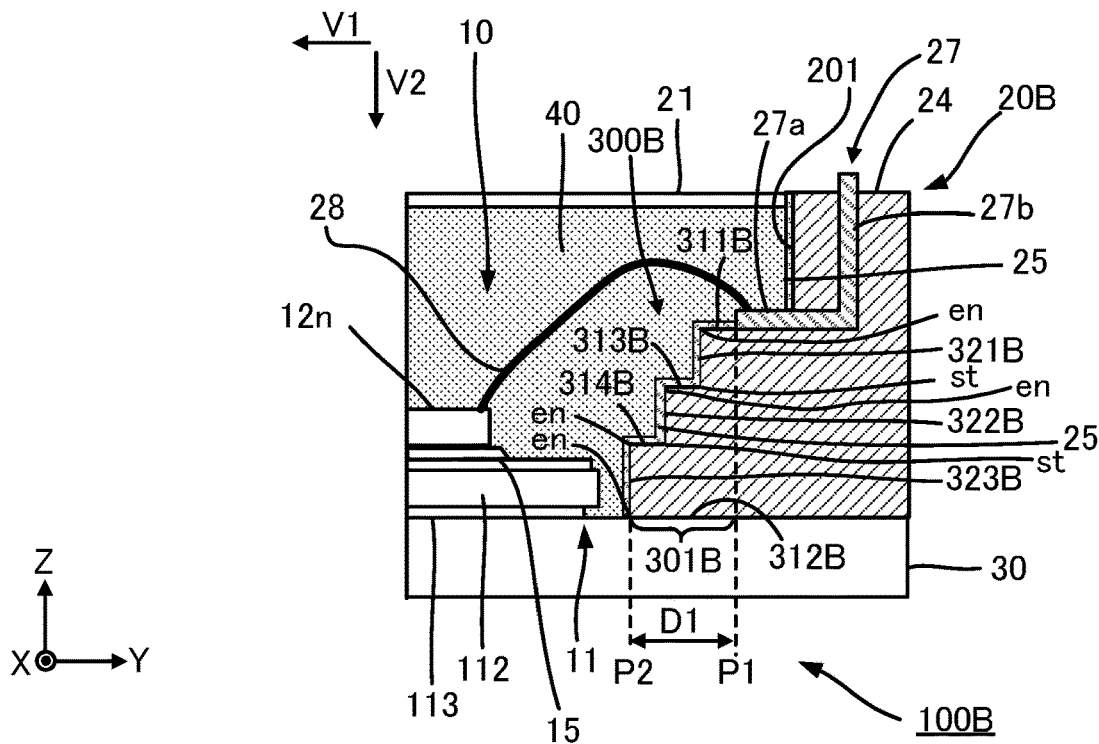
FIG. 4 is a cross-sectional view of a terminal block 300B of a semiconductor apparatus 100B according to a second embodiment.

FIG. 4 is a cross-sectional view illustrating a terminal block 300B of a semiconductor apparatus 100B according to a second embodiment. As in the first embodiment, a case 20B of the semiconductor apparatus 100B includes the terminal block 300B that extends in the first direction V1 (−Y direction) from the inner wall surface of the housing portion 201. The terminal block 300B includes a projecting portion 301B projecting from the first position P1 to the second position P2. The configurations of the first position P1 and the second position P2 are similar to those described in the first embodiment.

In this embodiment, the terminal block 300B has a first surface 311B farthest from the base 30 and a second surface 312B joined to the base 30. The inner terminal portion 27a is arranged on the first surface 311B.

The terminal block 300B has a third surface 313B (third surface) and 314B (fourth surface) located between the first surface 311B and the second surface 312B in the second direction V2 (−Z direction) approaching the base 30. That is, the terminal block 300B has third surfaces (two in this example). The third surface 314B is closer to the base 30 than the third surface 313B. The first surface 311B, the second surface 312B, and the third surfaces 313B and 314B are substantially parallel.

As in the first embodiment, the end of the first surface 311B in the first direction V1 is the end position en of the surface. The end of the second surface 312B in the first direction V1 is the end position en of the surface. The respective ends of the third surfaces 313B and 314B in the first direction V1 are the end positions en of these surfaces. The respective ends of the third surfaces 313B and 314B in a direction opposite to the first direction V1 are the start positions st of these surfaces. The projecting portion 301B has a connecting surface 321B that connects the end position en of the first surface 311B with the start position st of the third surface 313B. The projecting portion 301B has a connecting surface 323B that connects the end position en of the third surface 314B with the start position st of the third surface 313B. The projecting portion 301B further has a connecting surface (connecting surface 322B that connects the third surface 313B and the third surface 314B) that connects two third surfaces adjacent to each other in the second direction V2 (−Z direction). Specifically, the third surface 313B is a surface farthest from the base 30 among the two third surfaces 313B and 314B. The third surface 314B is a surface close to the base 30, and is adjacent to the third surface 313B in the second direction V2. The connecting surface 322B connects the end position en of the third surface 313B with the start position st of the third surface 314B. These connecting surfaces 321B, 322B, and 323B extend in the second direction V2 (that is, in the −Z direction) approaching the base 30. Specifically, the connecting surfaces 321B, 322B, and 323B are parallel to the XZ plane (inner wall surface of the housing portion 201). Thus, the projecting portion 301B has one step against the projecting portion 301A rather than the two steps in the first embodiment.

In this embodiment, similar effects are attained to those attained in the first embodiment. Further, the length in the Z axis direction of each of the connecting surfaces 321B, 322B, and 323B on which it is difficult to apply the primer is shorter than that in the first embodiment. Thus, compared to the first embodiment, it is easier to apply and confirm application of the primer.

Third Embodiment

Figure 5:
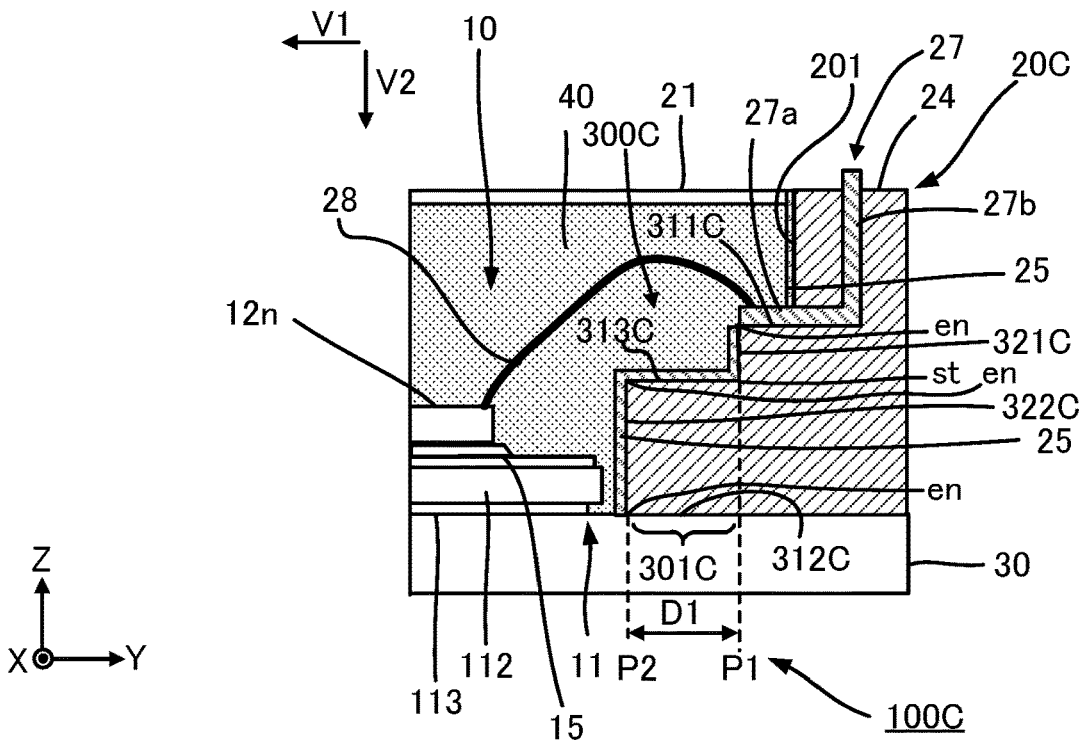
FIG. 5 is a cross-sectional view of a terminal block 300C of a semiconductor apparatus 100C according to a third embodiment.

FIG. 5 is a cross-sectional view illustrating a terminal block 300C of a semiconductor apparatus 100C according to a third embodiment. As in the first embodiment, a case 20C of the semiconductor apparatus 100C includes the terminal block 300C that extends in the first direction V1 (−Y direction) from the inner wall surface of the housing portion 201. The terminal block 300C includes a projecting portion 301C projecting from the first position P1 to the second position P2. The configurations of the first position P1 and the second position P2 are similar to those described in the first embodiment.

As in the first embodiment, the terminal block 300C has a first surface 311C and a second surface 312C. The projecting portion 301C has a third surface 313C located between the first surface 311C and the second surface 312C. The first, second and third surfaces 311C, 312C and 313C extend in the first direction V1, and are parallel to the XY plane.

As in the first embodiment, the projecting portion 301C includes a connecting surface 321C that connects the end position en of the first surface 311C with the start position st of the third surface 313C, and a connecting surface 322C that connects the end position en of the third surface 313C with the end position en of the second surface 312C. The connecting surfaces 321C and 322C extend in the second direction V2 (−Z direction) and are parallel to the XZ plane.

This embodiment differs from the first embodiment as follows. In the first embodiment, the distal end of the first surface 311A is located at a position further in the first direction V1 (−Y direction) than the first position P1 where the distal end portion of the inner terminal portion 27a is located. In contrast, in this embodiment, the distal end of the first surface 311C is at the first position P1, where the distal end of the inner terminal portion 27a is located, and the connecting surface 321C is located immediately below the first position P1. That is, in this embodiment, the first surface 311C is included in the terminal block 300C, but is not included in the projecting portion 301C.

Since the terminal block 300C has the projecting portion 301C that extends in the first direction V1 from the first position P1 of the distal end portion of the inner terminal portion 27a, similar effects are attained in this embodiment to those attained in the first embodiment.

Fourth Embodiment

Figure 6:
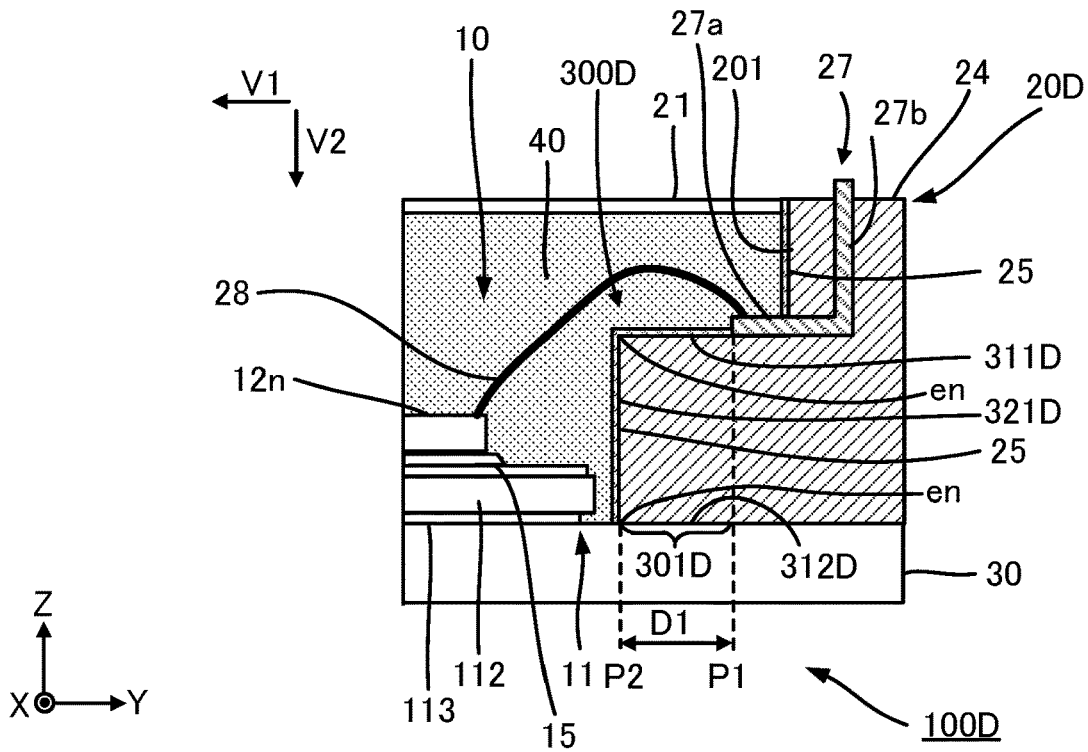
FIG. 6 is a cross-sectional view of a terminal block 300D of a semiconductor apparatus 100D according to a fourth embodiment.

FIG. 6 is a cross-sectional view illustrating a terminal block 300D of a semiconductor apparatus 100D according to a fourth embodiment. As in the first embodiment, the terminal block 300D includes a projecting portion 301D that extends from the first position P1 to the second position P2. The configurations of the first and second positions P1 and P2 are similar to those described in the first embodiment.

As in the first embodiment, the terminal block 300D has a first surface 311D and a second surface 312D. The first surface 311D and the second surface 312D extend in the first direction V1 and are parallel to the XY plane. The inner terminal portion 27a is arranged on the first surface 311D. However, the projecting portion 301D does not have a third surface located between the first surface 311D and the second surface 312D in the second direction V2 (−Z direction). The end position en of the first surface 311D and the end position en of a second surface 312E are both at the second position P2 further in the first direction V1 from the first position P1. The end position en of the first surface 311D and the end position en of the second surface 312E are connected via a connecting surface 321D. The connecting surface 321D extends in the second direction V2 (−Z direction) and is parallel to the XZ plane.

In this embodiment, since the terminal block 300D has the projecting portion 301D that extends in the first direction V1 from the first position P1 of the distal end portion of the inner terminal portion 27a, similar effects are attained in this embodiment as those attained in the first embodiment. In this embodiment, the length in the Z axis direction of the second connecting surface 321D on which it is difficult to apply and confirm application of the primer is longer than any of the lengths in the Z axis direction of the connecting surface 321A or 322A of the first embodiment. Therefore, from a view point of enhancing adhesion of the sealing material 40 to the inner wall surface of a case 20D, the first embodiment is preferable.

Fifth Embodiment

Figure 7:
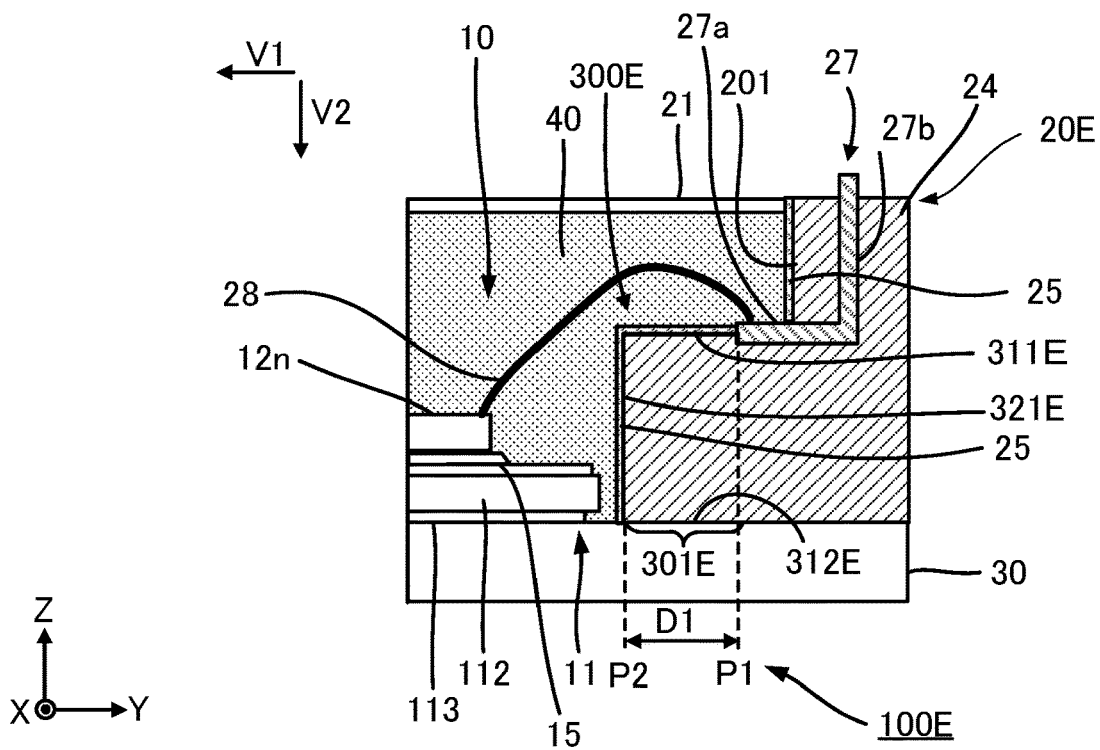
FIG. 7 is a cross-sectional view of a terminal block 300E of a semiconductor apparatus 100E according to a fifth embodiment.

FIG. 7 is a cross-sectional view illustrating a terminal block 300E of a semiconductor apparatus 100E according to a fifth embodiment. As in the first embodiment, the terminal block 300E includes a projecting portion 301E that extends from the first position P1 to the second position P2. The configurations of the first and second positions P1 and P2 are similar to those in the first embodiment. The configurations of the terminal block 300E and the projecting portion 301E are similar to those of the fourth embodiment. As in the fourth embodiment, the terminal block 300E includes a first surface 311E and a second surface 312E, and a connecting surface 321E that connects the end positions en of the first surface 311E with the second surface and 312E.

This embodiment differs from the fourth embodiment, as follows. In the fourth embodiment, the inner terminal portion 27a is arranged on the first surface 311D. In contrast, a half portion in the thickness direction (Z axis direction) of the inner terminal portion 27a in this embodiment is embedded in the terminal block 300E from the first surface 311E.

In this embodiment, similar effects are attained to those attained in the fourth embodiment. Further, a half portion in the thickness direction (Z axis direction) of the inner terminal portion 27a is embedded in the terminal block 300E.

Therefore, when the wiring member 28 is joined to the inner terminal portion 27a, the inner terminal portion 27a can be prevented from peeling away from the terminal block 300E.

Sixth Embodiment

Figure 8:
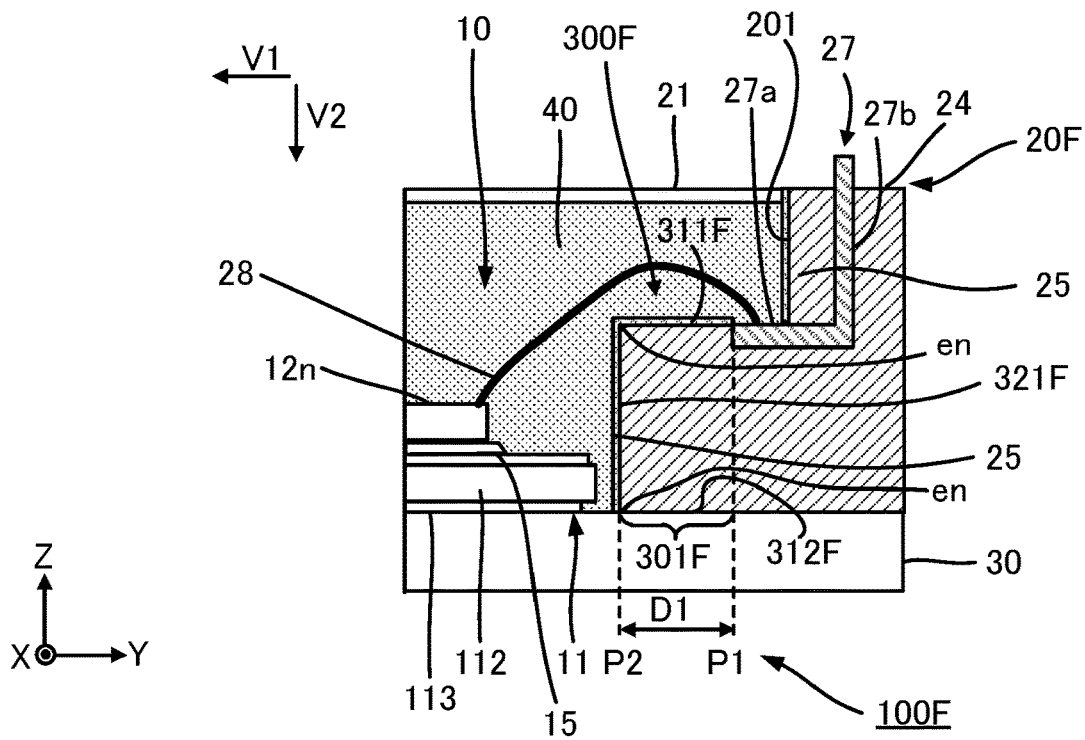
FIG. 8 is a cross-sectional view of a terminal block 300F of a semiconductor apparatus 100F according to a sixth embodiment.

FIG. 8 is a cross-sectional view illustrating a terminal block 300F of a semiconductor apparatus 100F according to a sixth embodiment. As in the fifth embodiment, the terminal block 300F includes a projecting portion 301F that extends from the first position P1 to the second position P2. The configurations of the first and second positions P1 and P2 are similar to those in the first embodiment. The configurations of the terminal block 300F and the projecting portion 301F are similar to those of the fifth embodiment. As in the fifth embodiment, the terminal block 300F includes a first surface 311F and a second surface 312F, and a connecting surface 321F that connects the end positions en of the first surface 311F with the second surface and 312F.

This embodiment differs from the fifth embodiment, as follows. In the fifth embodiment, a half portion in the thickness direction (Z axis direction) of the inner terminal portion 27a is embedded in the terminal block 300E from the first surface 311E. In contrast, in this embodiment, most of the inner terminal portion 27a in the thickness direction (Z axis direction) is embedded in the terminal block 300F from the first surface 311F, and only an upper surface of the inner terminal portion 27a is exposed from the first surface 311F.

In this embodiment, effects are attained similar to those attained in the fourth and fifth embodiments. Further, most of the inner terminal portion 27a is embedded in the terminal block 300F. Thus, compared to the fourth and fifth embodiments, when the wiring member 28 is joined to the inner terminal portion 27a, a holding force that prevents the inner terminal portion 27a from peeling away from the terminal block 300F can be increased.

Seventh Embodiment

Figure 9:
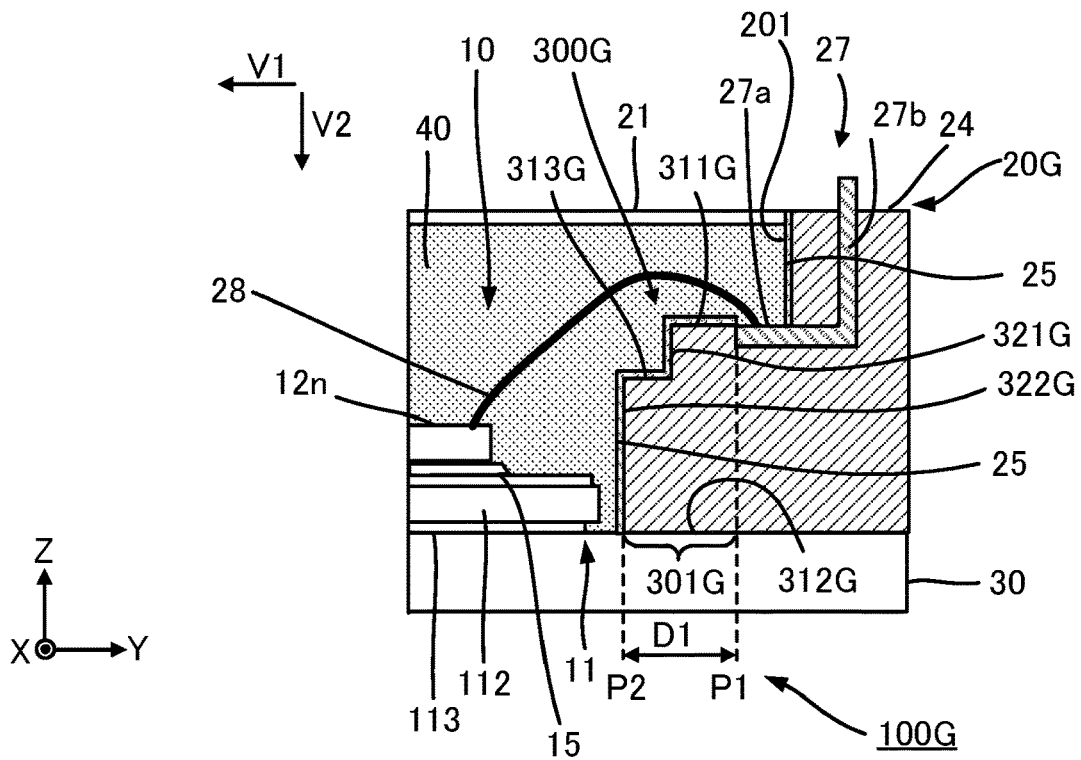
FIG. 9 is a cross-sectional view of a terminal block 300G of a semiconductor apparatus 100G according to a seventh embodiment.

FIG. 9 is a cross-sectional view illustrating a terminal block 300G of a semiconductor apparatus 100G according to a seventh embodiment. As in the first embodiment, the terminal block 300G includes a projecting portion 301G that extends from the first position P1 to the second position P2. The configurations of the first and second positions P1 and P2 are similar to those in the first embodiment. The configurations of the terminal block 300G and the projecting portion 301G are similar to those of the first embodiment. As in the first embodiment, the terminal block 300G has a first surface 311G, a second surface 312G, and a third surface 313G located between the first surface 311G and the second surface 312G in the second direction V2 (−Z direction). The first, second and third surfaces 311G, 312G and 313G extend in the first direction V1 and are parallel to the XY plane. The terminal block 300G includes a connecting surface 321G that connects the end position en of the first surface 311G with the start position st of the third surface 313G, and a connecting surface 322G that connects the end position en of the third surface 313G with the end position en of the second surface 312G. The connecting surfaces 321G and 322G extend in the second direction V2 and are parallel to the XZ plane.

This embodiment differs from the first embodiment, as follows. In the first embodiment, the inner terminal portion 27a is arranged on the first surface 311A. In contrast, in this embodiment, most of the inner terminal portion 27a in the thickness direction (Z axis direction) is embedded in the terminal block 300G from the first surface 311G, and only the upper surface of the inner terminal portion 27a is exposed from the first surface 311G.

In this embodiment, similar effects are attained to those attained in the first embodiment. Further, most of the inner terminal portion 27a is embedded in the terminal block 300F. Therefore, when the wiring member 28 is joined to the inner terminal portion 27a, the inner terminal portion 27a can be prevented from peeling away from the terminal block 300F.

Eighth Embodiment

Figure 10:
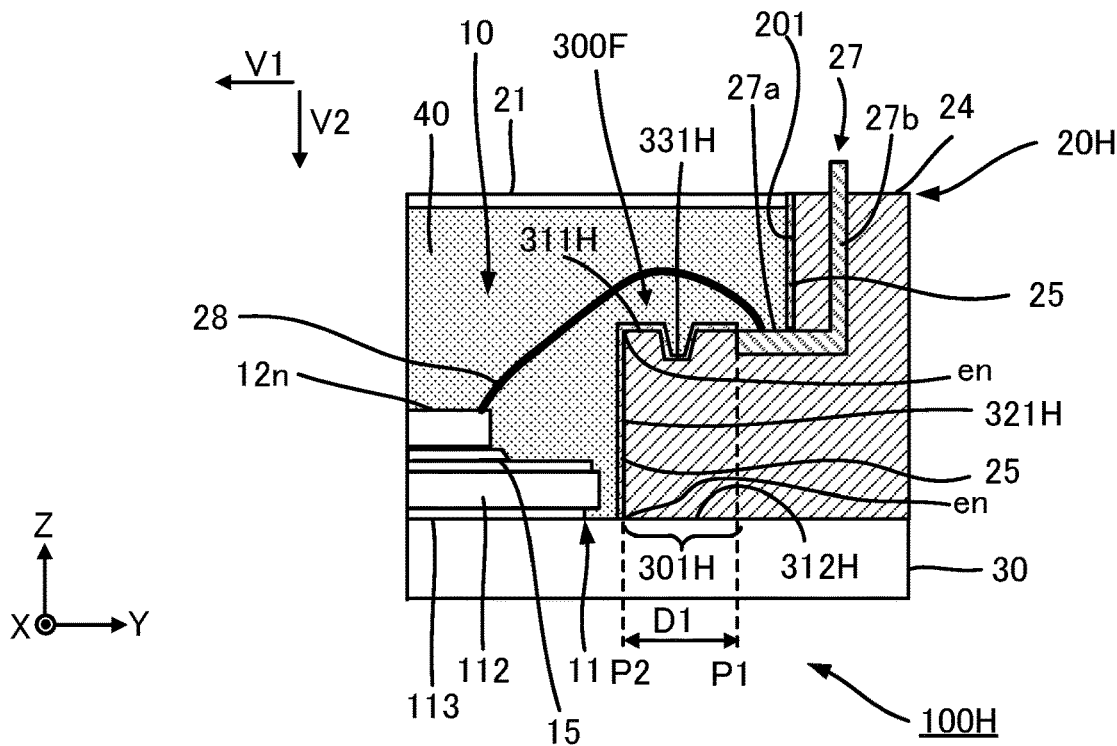
FIG. 10 is a cross-sectional view of a terminal block 300H of a semiconductor apparatus 100H according to an eighth embodiment.

FIG. 10 is a cross-sectional view illustrating a terminal block 300H of a semiconductor apparatus 100H according to an eighth embodiment. As in the sixth embodiment, the terminal block 300H includes a projecting portion 301H that extends from the first position P1 to the second position P2. The configurations of the first and second positions P1 and P2 are similar to those in the first embodiment. As in the sixth embodiment, the terminal block 300H has a first surface 311H and a second surface 312H. The first and second surfaces 311H and 312H extend in the first direction V1 and are parallel to the XY plane. The terminal block 300H has a connecting surface 321H that connects the end position en of the first surface 311H with the end position en of the second surface 312H. The connecting surface 321H extends in the second direction V2 and is parallel to the XZ plane. As in the sixth embodiment, most of the inner terminal portion 27a in the thickness direction (Z axis direction) is embedded in the terminal block 300H from the first surface 311H, and only the upper surface of the inner terminal portion 27a is exposed from the first surface 311H.

This embodiment differs from the sixth embodiment, as follows. In the sixth embodiment, the first surface 311F belonging to the projecting portion 301F is flat over its entire region except for that in which the inner terminal portion 27a is embedded. In contrast, in this embodiment, a recessed portion 331H is formed on the first surface 311H belonging to the projecting portion 301H. The recessed portion 331H is a groove-shaped recessed portion having a width and a depth of at least 1 mm and extending in the X axis direction.

In this embodiment, compared to the sixth embodiment, since the recessed portion 331H is formed on the first surface 311H, the creepage distance between the base 30 and the inner terminal portion 27a is longer by the amount of the recessed portion 331H. Therefore, it is possible to obtain an effect that if the sealing material 40 peels away, good insulation is maintained comparative to the sixth embodiment. Further, since the recessed portion 331H is provided with the first surface 311H, adhesion of the sealing material 40 is enhanced by the recessed portion 331H.

Ninth Embodiment

Figure 11:
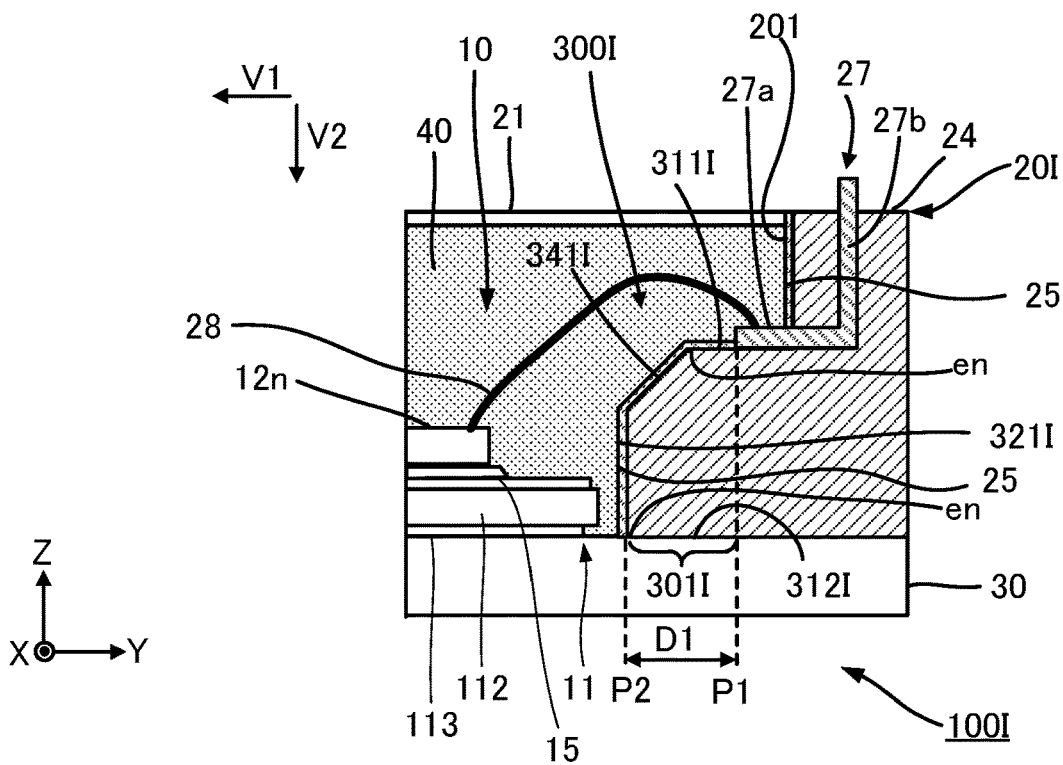
FIG. 11 is a cross-sectional view of a terminal block 300I of a semiconductor apparatus 100I according to a ninth embodiment.

FIG. 11 is a cross-sectional view illustrating a terminal block 300I of a semiconductor apparatus 100I according to a ninth embodiment. As in the first embodiment, the terminal block 300I of a case 201 includes a projecting portion 301I that extends from the first position P1 to the second position P2. The configurations of the first and second positions P1 and P2 are similar to those in the first embodiment. As in the first embodiment, the terminal block 300I has a first surface 311I and a second surface 312I. The first and second surfaces 311I and 312I extend in the first direction V1 and are parallel to the XY plane. The inner terminal portion 27a is arranged on the first surface 311I. The first surface 311I extends to the end position en further in the first direction V1 (-Y direction) than the first position P1 of the distal end of the inner terminal portion 27a.

For the projecting portion 301I, the third surface 313A and the connecting surface 321A in the first embodiment are replaced with an inclined surface 341I at an acute angle relative to the first direction V1 (-Y direction). The inclined surface 341I extends obliquely downward (in the -Y direction and the -Z direction) from the end position en of the first surface 311I. Specifically, the inclined surface 341I is obtained by inclining a surface parallel to the XY plane by a predetermined angle (90 degrees or less) about the rotation axis with the X axis passing through the end position en as the rotation axis. The distal end of the inclined surface 341I in the first direction V1 is connected to the end position en of the second surface 312I via a connecting surface 321I. The connecting surface 321I extends in the second direction V2 (-Z direction) and is parallel to the XZ plane.

In this embodiment, since the terminal block 300I includes the projecting portion 301I, the creepage distance of the path from the base 30 to the distal end portion of the inner terminal portion 27a can be increased as in the first embodiment. Therefore, if the sealing material 40 peels away, good insulation is maintained between the base 30 and the inner terminal portion 27a.

In this embodiment, there is no element equivalent to the connecting surface 321A in the first embodiment. The connecting surface 321A is along the Z axis direction, and it is difficult to apply and confirm application of the base film 25 as a primer. In contrast, the inclined surface 341I is provided on the projecting portion 301I in this embodiment, and thus it is easy to apply a primer and confirm application of the primer. Therefore, compared to the first embodiment, it is easier to apply the primer and confirm application of the primer to the inner wall surface of the case 20A.

Tenth Embodiment

Figure 12:
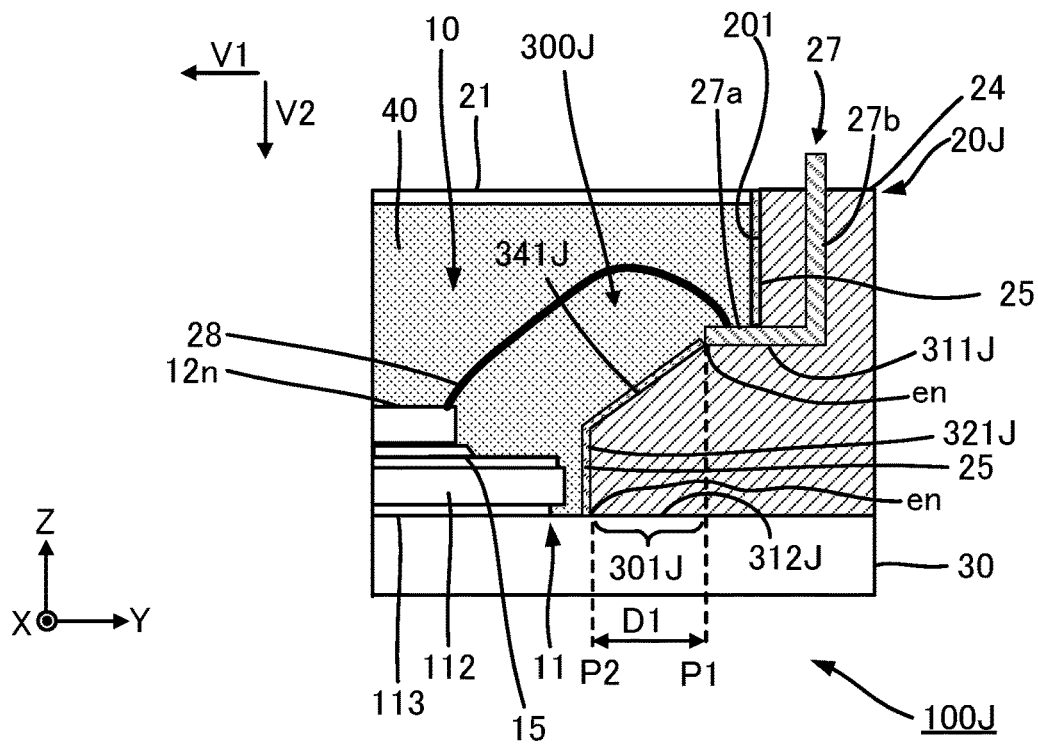
FIG. 12 is a cross-sectional view of a terminal block 300J of a semiconductor apparatus 100J according to a tenth embodiment.

FIG. 12 is a cross-sectional view illustrating a terminal block 300J of a semiconductor apparatus 100J according to a tenth embodiment. As in the ninth embodiment, the terminal block 300J of a case 20J includes a projecting portion 301J that extends from the first position P1 to the second position P2. The configurations of the first and second positions P1 and P2 are similar to those in the first embodiment. As in the ninth embodiment, the terminal block 300J has a first surface 311J, a second surface 312J, an inclined surface 341J, and a connecting surface 321J. The first surface 311J and the second surface 312J extend in the first direction V1 and are parallel to the XY plane. The connecting surface 321J extends in the second direction V2 and is parallel to the XZ plane. The inclined surface 341J is at an acute angle relative to the first direction V1.

This embodiment differs from the ninth embodiment, as follows. In the ninth embodiment, the first surface 311I extends to the end position en further in the first direction V1 (-Y direction) than the first position P1 of the distal end of the inner terminal portion 27a. In contrast, the first surface 311J in this embodiment extends only to the first position P1. The first surface 311J is connected to the inclined surface 341J at the first position P1. In this embodiment, effects are attained similar to those attained in the ninth embodiment.

Eleventh Embodiment

Figure 13:
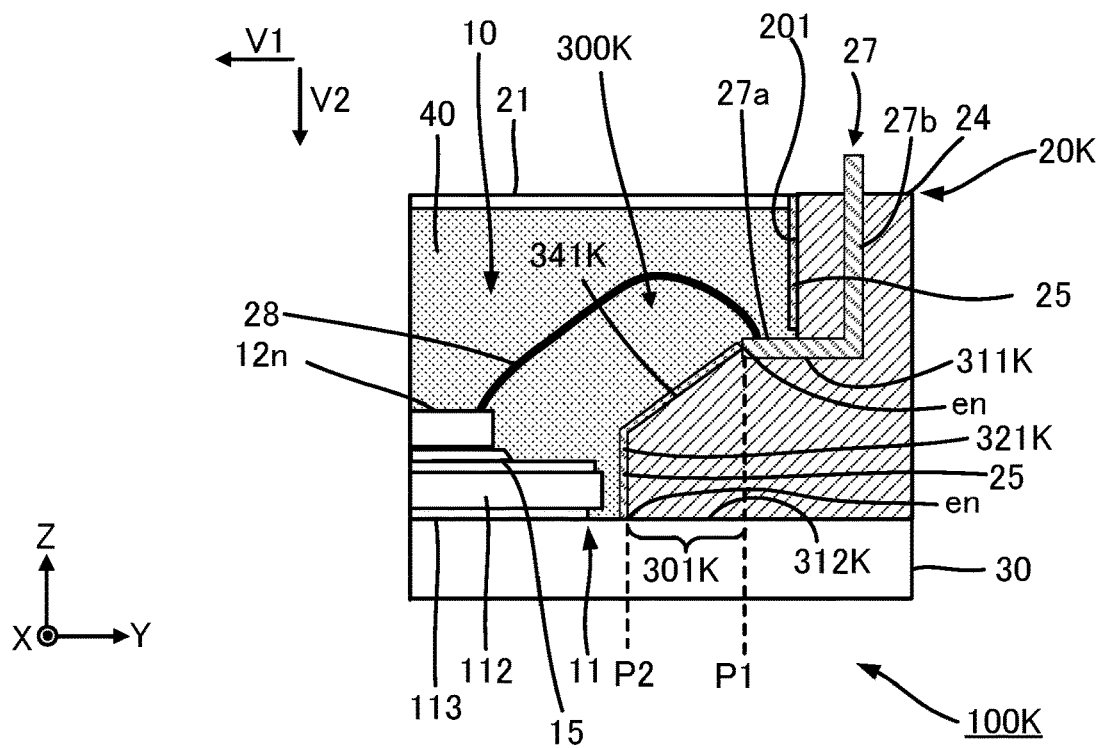
FIG. 13 is a cross-sectional view of a terminal block 300K of a semiconductor apparatus 100K according to an eleventh embodiment.

FIG. 13 is a cross-sectional view illustrating a terminal block 300K of a semiconductor apparatus 100K according to an eleventh embodiment. As in the tenth embodiment, the terminal block 300K of a case 20K includes a projecting portion 301K that extends from the first position P1 to the second position P2. The configurations of the first and second positions P1 and P2 are similar to those in the first embodiment. As in the tenth embodiment, the terminal block 300K has a first surface 311K, a second surface 312K, an inclined surface 341K, and a connecting surface 321K.

This embodiment differs from the tenth embodiment in the following points. In the tenth embodiment, the inner terminal portion 27a is arranged on the first surface 311J. In contrast, in this embodiment, a half portion of the inner terminal portion 27a in the thickness direction (Z axis direction) is embedded in the terminal block 300F from the first surface 311F.

In this embodiment, effects are attained similar to those attained in the tenth embodiment. Further, a half portion of the inner terminal portion 27a is embedded in the terminal block 300K. Therefore, when the wiring member 28 is joined to the inner terminal portion 27a, the inner terminal portion 27a can be prevented from peeling away from the terminal block 300K.

Twelfth Embodiment

Figure 14:
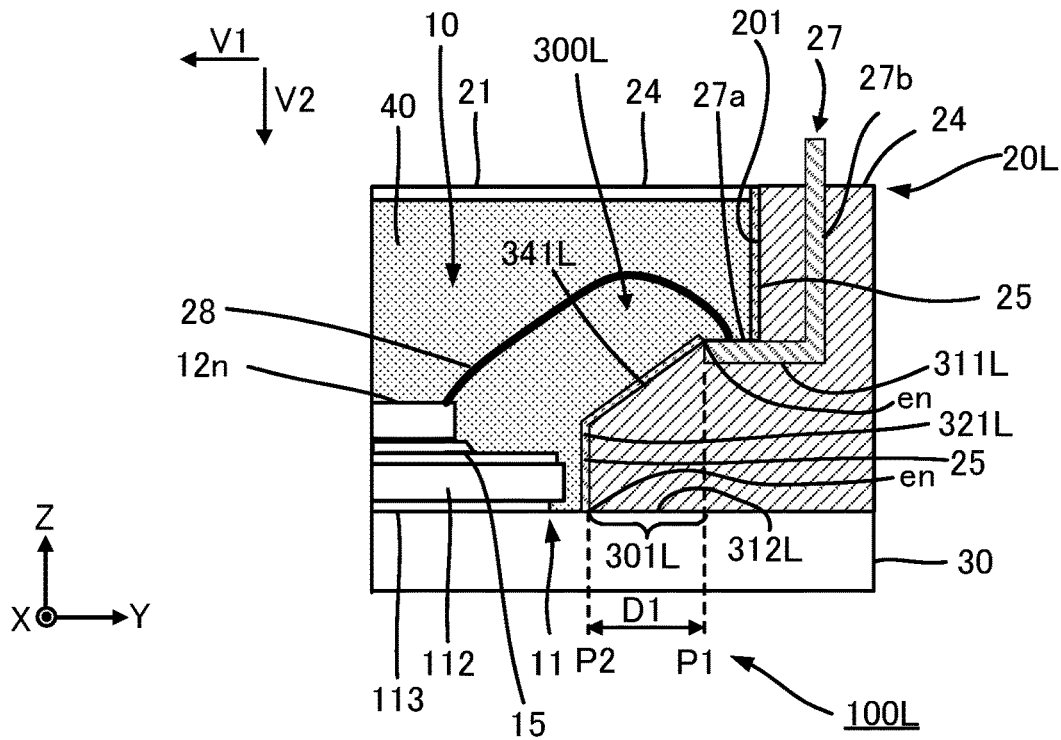
FIG. 14 is a cross-sectional view of a terminal block 300L of a semiconductor apparatus 100L according to a twelfth embodiment.

FIG. 14 is a cross-sectional view illustrating a terminal block 300L of a semiconductor apparatus 100L according to a twelfth embodiment. As in the eleventh embodiment, the terminal block 300L of a case 20L includes a projecting portion 301L that extends from the first position P1 to the second position P2. The configurations of the first and second positions P1 and P2 are similar to those in the first embodiment. As in the eleventh embodiment, the terminal block 300L has a first surface 311L, a second surface 312L, an inclined surface 341L, and a connecting surface 321L.

This embodiment differs from the eleventh embodiment, as follows. In the eleventh embodiment, a half portion in the thickness direction (Z axis direction) of the inner terminal portion 27a is embedded in the terminal block 300K from the first surface 311K. In contrast, in this embodiment, most of the inner terminal portion 27a in the thickness direction (Z axis direction) is embedded in the terminal block 300L from the first surface 311L, and only the upper surface of the inner terminal portion 27a is exposed from the first surface 311L.

In this embodiment, effects are attained similar to those attained in the tenth and eleventh embodiments. Further, most of the inner terminal portion 27a is embedded in the terminal block 300L. Therefore, when the wiring member 28 is joined to the inner terminal portion 27a, the holding force that allows the inner terminal portion 27a not to peel off from the terminal block 300L can be increased as compared with the tenth and eleventh embodiments.

Thirteenth Embodiment

Figure 15:
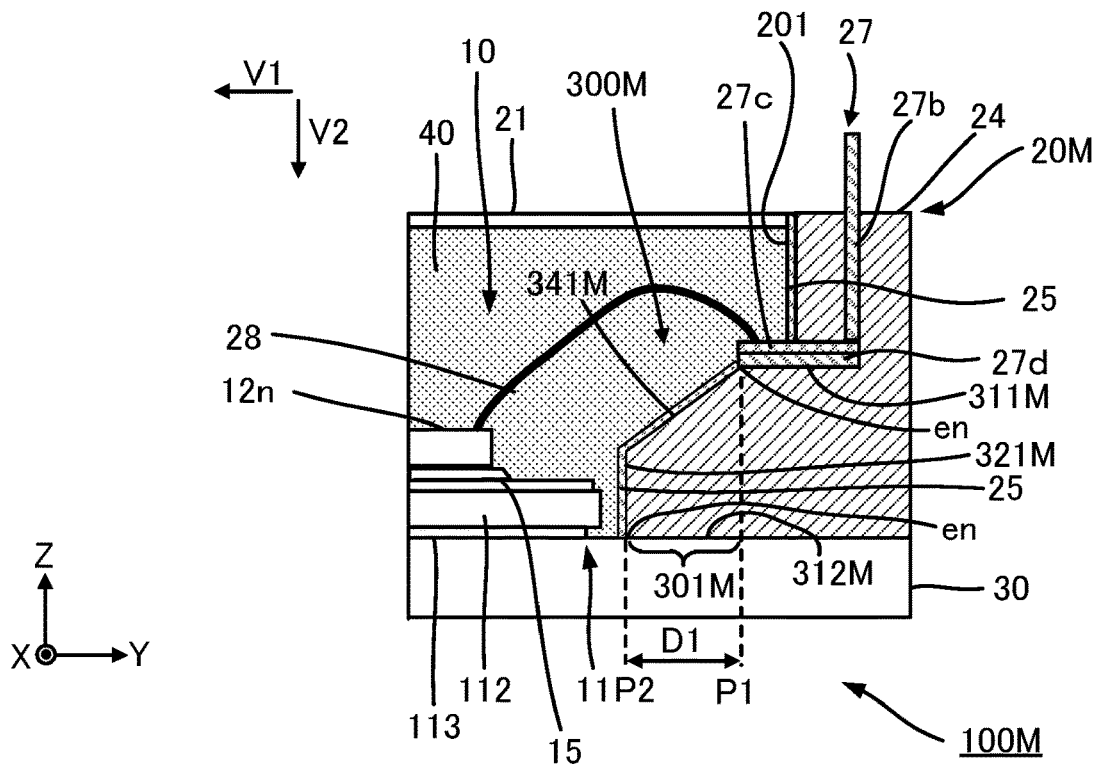
FIG. 15 is a cross-sectional view of a terminal block 300M of a semiconductor apparatus 100M according to a thirteenth embodiment.

FIG. 15 is a cross-sectional view illustrating a terminal block 300M of a semiconductor apparatus 100M according to a thirteenth embodiment. As in the tenth embodiment, the terminal block 300M of a case 20M includes a projecting portion 301M projecting from the first position P1 to the second position P2. The definitions of the first and second positions P1 and P2 are similar to those in the first embodiment. As in the tenth embodiment, the terminal block 300M has a first surface 311M, a second surface 312M, an inclined surface 341M, and a connecting surface 321M.

This embodiment differs from the tenth embodiment, as follows. In the tenth embodiment, the inner terminal portion 27a is arranged on the first surface 311J. In contrast, in this embodiment, a wiring pattern 27c is formed on an upper surface of a printed circuit board 27d, and the printed circuit board 27d is arranged on the first surface 311M. The wiring pattern 27c of the printed circuit board 27d acts as a terminal electrically connected to the semiconductor element 12p or 12n via the wiring member 28. The outer terminal portion 27b that extends in the Z axis direction is electrically connected to the wiring pattern 27c of the printed circuit board 27d in the case 20M.

In this embodiment, effects are attained similar to those attained in the tenth embodiment. In this embodiment, the wiring pattern 27c of the printed circuit board 27d functions as a terminal. Therefore, when positions of the terminal and the outer terminal portion 27b in the XY plane are restricted, the shape of the wiring pattern 27c can be adjusted.

Other Embodiments

Although the first to thirteenth embodiments of the present invention have been described above, other embodiments of the present invention are conceivable, as described below.

(1) In the first to eighth embodiments (FIGS. 1 to 10), three or more third surfaces may be provided between the first surface and the second surface. That is, four or more step portions having the first surface or the third surface and the connecting surfaces may be provided between the first position P1 and the second position P2.

(2) In the eighth embodiment (FIG. 10), the recessed portion 331H is formed in the first surface 311F (the first surface 311H in FIG. 10) of the sixth embodiment (FIG. 8). However, a recessed portion may be formed on the first surface of an embodiment other than the sixth embodiment. Alternatively, a recessed portion may be formed on a surface (for example, the third surface) other than the first surface in the projecting portion.

(3) In the thirteenth embodiment (FIG. 15), the printed circuit board 27d is arranged on the first surface 311J (the first surface 311M in FIG. 15) of the tenth embodiment (FIG. 12). However, the printed circuit board 27d may be arranged on the first surface of each embodiment other than the tenth embodiment.

(4) In the ninth to thirteenth embodiments (FIGS. 11 to 15), the inclined surfaces 341I to 341M extend to the position above the base 30 (+Z direction), and are connected to the base 30 via the connecting surfaces 321I to 321M. However, the inclined surfaces 341I to 341M may extend to the base 30.

DESCRIPTION OF REFERENCES SIGNS 100A to 100M: Semiconductor apparatus
20A to 20M: Case
201: Housing portion
300A to 300M: Terminal block
301A to 301M: Projecting portion
40: Sealing material
30: Base
11: Insulating substrate
10: Semiconductor unit
12p, 12n: Semiconductor element
27: Terminal
27a: Inner terminal portion
27b: Outer terminal portion
28: Wiring member
311A to 311M: First surface
312A to 312M: Second surface
313A to 313C, 313G: Third surface
321A to 321M, 322A to 322C, 322G, 323B: Connecting surface
15: Joining material
112: Insulating layer
113: Metal layer
341I to 341M: Inclined surface
25: Base film
114, 114a, 114b, 114c: Conductor pattern
50: Connecting portion
51p, 51n: Connection terminal
13p, 13n: Wiring portion
21 to 24: Side wall

What is claimed is:

1. A semiconductor apparatus comprising:
a base;
an insulating substrate arranged on the base;
a semiconductor element arranged on the insulating substrate;
a case joined to the base and housing the semiconductor element; and
a sealing material supplied in the case, wherein:
the case includes a terminal block that extends in a first direction from an inner wall surface of the case,
the terminal block is arranged thereon a terminal that is electrically connected to the semiconductor element via a wiring member,
the terminal block includes a projecting portion that extends, in plan view, in the first direction from a first position of a distal end portion of the terminal to a second position, and
a first distance between the first position and the second position is at least 1 mm.

2. The semiconductor apparatus according to claim 1, wherein:
the terminal block includes:
a first surface located farthest from the base; and
a second surface joined to the base,
the terminal is arranged on the first surface, and
the projecting portion is provided between the first surface and the second surface.

3. The semiconductor apparatus according to claim 2, wherein:
the terminal block further includes a third surface between the first surface and the second surface in a second direction approaching the base.

4. The semiconductor apparatus according to claim 3, wherein the first surface, the second surface, and the third surface are substantially parallel.

5. The semiconductor apparatus according to claim 4, wherein:
the first surface has an end in the first direction, the end being an end position of the first surface,
the second surface has an end in the first direction, the end being an end position of the second surface,
the third surface has:
an end in the first direction, the end being an end position of the third surface; and
an other end in a direction opposite to the first direction, the other end being a start position of the third surface, and
the terminal block includes:

a connecting surface that extends in the second direction and connects the end position of the first surface with the start position of the third surface; and a connecting surface that extends in the second direction and connects the end position of the third surface with the end position of the second surface.

6. The semiconductor apparatus according to claim 2, wherein the projecting portion includes an inclined surface that forms an acute angle relative to the first direction.

7. The semiconductor apparatus according to claim 2, wherein the terminal has a surface protruding from the first surface.

8. The semiconductor apparatus according to claim 2, wherein:
the terminal block further includes:
a third surface; and
a fourth surface,
the third surface and the fourth surface are located between the first surface and the second surface in a second direction approaching the base, and
the fourth surface is adjacent to the third surface in the second direction and is closer to the base than the third surface.

9. The semiconductor apparatus according to claim 8, wherein the first surface, the second surface, the third surface, and the fourth surface are substantially parallel.

10. The semiconductor apparatus according to claim 9, wherein:
the third surface has:
an end in the first direction, the end being an end position of the third surface; and
an other end in a direction opposite to the first direction, the other end being a start position of the third surface, the fourth surface has an end in the direction opposite to the first direction, the end being a start position of the fourth surface, and the terminal block further includes a connecting surface that extends in the second direction and connects the end position of the third surface with the start position of the fourth surface.

11. The semiconductor apparatus according to claim 10, wherein:
the first surface has an end in the first direction, the end being an end position of the first surface,
the second surface has an end in the first direction, the end being an end position of the second surface, and
the fourth surface has an end in the first direction, the end being an end position of the fourth surface, and
the terminal block further includes:
a connecting surface that extends in the second direction and connects the end position of the first surface with the start position of the third surface; and
a connecting surface that extends in the second direction and connects the end position of the fourth surface with the end position of the second surface.

12. The semiconductor apparatus according to claim 1, wherein the projecting portion includes a recessed portion.

13. The semiconductor apparatus according to claim 1, wherein a part in a longitudinal direction of the terminal is embedded in the case.

14. The semiconductor apparatus according to claim 1, further comprising a printed circuit board including the terminal,
wherein the printed circuit board is arranged on the terminal block.

* * * * *